(12) United States Patent
Jain

(10) Patent No.: US 9,444,481 B1
(45) Date of Patent: Sep. 13, 2016

(54) ANALOG TO DIGITAL CONVERTER

(71) Applicant: Texas Instruments Incorporated, Dallas, TX (US)

(72) Inventor: Dinesh Jain, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/886,875

(22) Filed: Oct. 19, 2015

(51) Int. Cl.
*H03M 1/12* (2006.01)
*H03M 1/10* (2006.01)
*H03M 1/46* (2006.01)
*H03K 4/06* (2006.01)

(52) U.S. Cl.
CPC .............. *H03M 1/1014* (2013.01); *H03K 4/06* (2013.01); *H03M 1/12* (2013.01); *H03M 1/466* (2013.01)

(58) Field of Classification Search
CPC .... H03M 1/1014; H03M 1/466; H03M 1/12; H03K 4/06

USPC .......................................... 341/155, 110, 147
See application file for complete search history.

(56) References Cited

U.S. PATENT DOCUMENTS

| 4,804,939 | A | * | 2/1989 | Cake | ....................... | H03M 1/00 324/99 D |
| 6,956,413 | B2 | * | 10/2005 | Bailey | .................... | H03K 4/026 327/131 |
| 7,884,748 | B2 | * | 2/2011 | Delagnes | .............. | G04F 10/005 341/156 |
| 8,724,001 | B2 | * | 5/2014 | Ay | ........................ | H03M 1/123 348/308 |

* cited by examiner

*Primary Examiner* — Brian Young
(74) *Attorney, Agent, or Firm* — John R. Pessetto; Frank D. Cimino

(57) ABSTRACT

An analog to digital converter includes an analog input and a voltage comparator coupled to the analog input for comparing a voltage at the analog input to a digitally synthesized waveform. A digital to analog converter (DAC) generates the digitally synthesized waveform. The DAC includes a plurality of capacitors selectively connected in parallel wherein the period between the selection of capacitors is less than the settling time of the voltage across the capacitors.

16 Claims, 4 Drawing Sheets

ANALOG TO DIGITAL CONVERTER

BACKGROUND

Analog to digital converters (ADCs) convert analog signals to digital signals. In some classes of ADCs, such as ramp converters, a voltage ramp is compared with the analog input using a comparator. When the voltage of the voltage ramp is equal to the analog input signal, the comparator generates a zero crossing signal and causes the digital signal to be generated. In these architectures, it is important to generate accurate ramp voltages because the ramp voltage is compared to the analog signal to generate the digital signal.

Many of the circuits that generate ramp voltages rely on a constant current source that charges capacitors. For example, a constant current source charges a capacitor wherein the voltage across the charging capacitor is the ramp voltage. The slope of the ramp voltage depends upon the absolute value of the current source and value of the capacitor. In order to generate highly accurate ramp voltages, the current source and/or the capacitor needs to be trimmed very accurately, which is difficult and time consuming.

SUMMARY

An analog to digital converter includes an analog input and a voltage comparator coupled to the analog input for comparing a voltage at the analog input to a digitally synthesized waveform. A digital to analog converter (DAC) generates the digitally synthesized waveform. The DAC includes a plurality of capacitors selectively connected in parallel wherein the period between the selection of capacitors is less than the settling time of the voltage across the capacitors.

DETAILED DESCRIPTION

Analog to digital converters (ADCs) and methods for converting analog signals to digital signals are disclosed herein. Digital to analog converters (DACs) within the ADCs generate digitally synthesized waveforms that are compared to an analog input signal. In some examples the waveforms are ramp waveforms, however, other waveforms may be implemented. The digitally synthesized waveforms do not fully settle between transitions in their digital signals, so the resulting waveforms closely match ideal analog waveforms.

Figure 1:
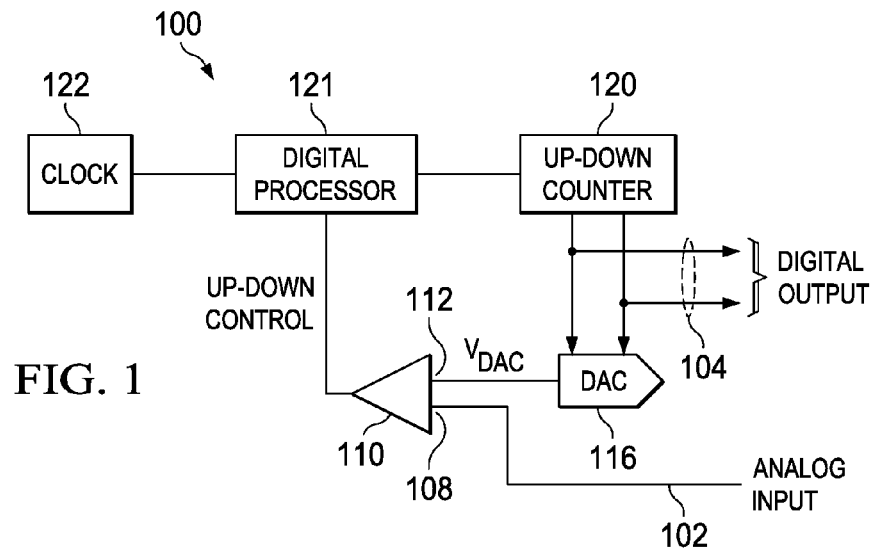
FIG. 1 is a block diagram of an analog to digital converter (ADC).

FIG. 1 is a block diagram of an ADC 100. The ADC 100 converts an analog signal received at an analog input 102 to digital signals that are output at a digital output 104. The ADC 100 is an asynchronous type ADC that continually tracks the input analog signal. The analog input 102 is coupled to a first input 108 of a comparator 110. A second input 112 of the comparator 110 is coupled to the output of a digital to analog converter (DAC) 116. In the examples described herein the DAC 116 generates a digitally synthesized ramp voltage that is input to the second input 112 of the comparator 110 where it is compared to the analog signal received at the first input 108 of the comparator 110. In other examples the DAC 116 generates other digitally synthesized waveforms that serve the same purpose as the ramp waveforms described herein. The output of the comparator 110 changes when the analog signal at the analog input 102 crosses or is equal to the voltage output by the DAC 116.

The signal generated by the comparator 110 is sometimes referred to as the up-down control and indicates whether a counter 120 counts up or down. The up-down control generated by the comparator 110 is coupled to a digital processor 121. The digital processor 121 is also coupled to the output of a clock 122. The digital processor 121 controls the dynamic behavior of a control loop described below.

The ADC 100 operates as a control loop as described below. The output of the comparator 110, which is referred to as the up-down control, indicates whether the analog input 108 coupled to the comparator is higher or lower than the last output of the DAC 116. The objective of the digital processor 121 is to control the counter 120 and DAC 116 so that the DAC output follows the analog signal at the analog input 102. During this operation, the output of the DAC 116 can eventually cross the analog input signal. The up-down control reverses its polarity indicating to the digital processor 121 to stop the control loop operation. A similar operation may be initiated by the digital processor 121 at a later point in time. This control loop forces the output of the DAC 116 to weave around the analog input signal creating a zero-crossing event. The above-described control loop is an example of one of a plurality of different control loops that may be implemented in the ADC 100.

The output of the digital processor 121 is coupled to the counter 120, which indicates the direction that the counter 120 counts. The output of the counter 120 is coupled to the digital output 104 and the input of the DAC 116, wherein the output of the counter 120 is converted to an analog signal for comparison with the analog input signal.

The DAC 116 generates a reference ramp voltage, which is sometimes referred to as a digitally synthesized signal. The analog input of the comparator 110 is continuously compared to the reference ramp voltage generated by the DAC 116. The voltage generated by the DAC 116 in conventional ADCs is allowed to settle fully between the time a first digital signal and a second digital signal are received from the counter 120. This type of voltage ramp generation is discontinuous in nature because the ramp voltage has settled and then is set to a different voltage on the subsequent clock signal. In this conventional method of operation, the maximum achievable effective number of bits (ENOB) is determined by the resolution or step-size of the DAC 116.

Figure 2:
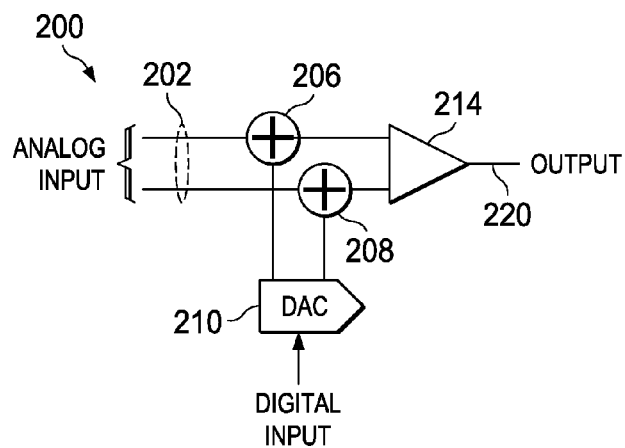
FIG. 2 is a block diagram of the front end of an asynchronous ADC.

FIG. 2 is a block diagram of the front end of an asynchronous ADC 200 that generates digital signals based on analog input signals. The ADC 200 includes an analog input 202 that receives analog input signals which are to be converted to digital signals. The analog input 202 has two lines for a differential input that are coupled to a first adder 206 and a second adder 208. In other examples, the analog input has one line and operates in a single ended mode. Both the first adder 206 and the second adder 208 are coupled to the differential output of a DAC 210. The DAC 210 generates a differential, digitally synthesized waveform, such as an analog ramp voltage, in response to a digital input. The outputs of the first and second adders 206 and 208 are coupled to the inputs of a comparator 214. The output 220 of the comparator 214 is the output of the front end of the ADC 200.

The analog input signal is input to the first and second adders 206 and 208 where the outputs of the DAC 210 are subtracted from the analog input signal. In the embodiment of FIG. 2, the outputs of the DAC 210 are ramp voltages similar to or identical to the ramp voltage output by the DAC 116 of FIG. 1. In other examples, functions other than ramp voltages may be output by the DAC 116. When the ramp voltages are equal to the analog input signals, the difference at the input of the comparator 214 reaches zero or its common mode voltage and changes the output state of the comparator 214. This event is sometimes referred to as a zero crossing. A digital signal is generated during the zero crossing. As with the ADC 100 of FIG. 1, a discontinuous, digitally synthesized ramp voltage has adverse effects on the accuracy of the analog to digital conversion of the ADC 200. For example, the discontinuous signal causes errors in the zero crossing, which result in errors in the digital signal generated by the ADC 200.

Figure 3:
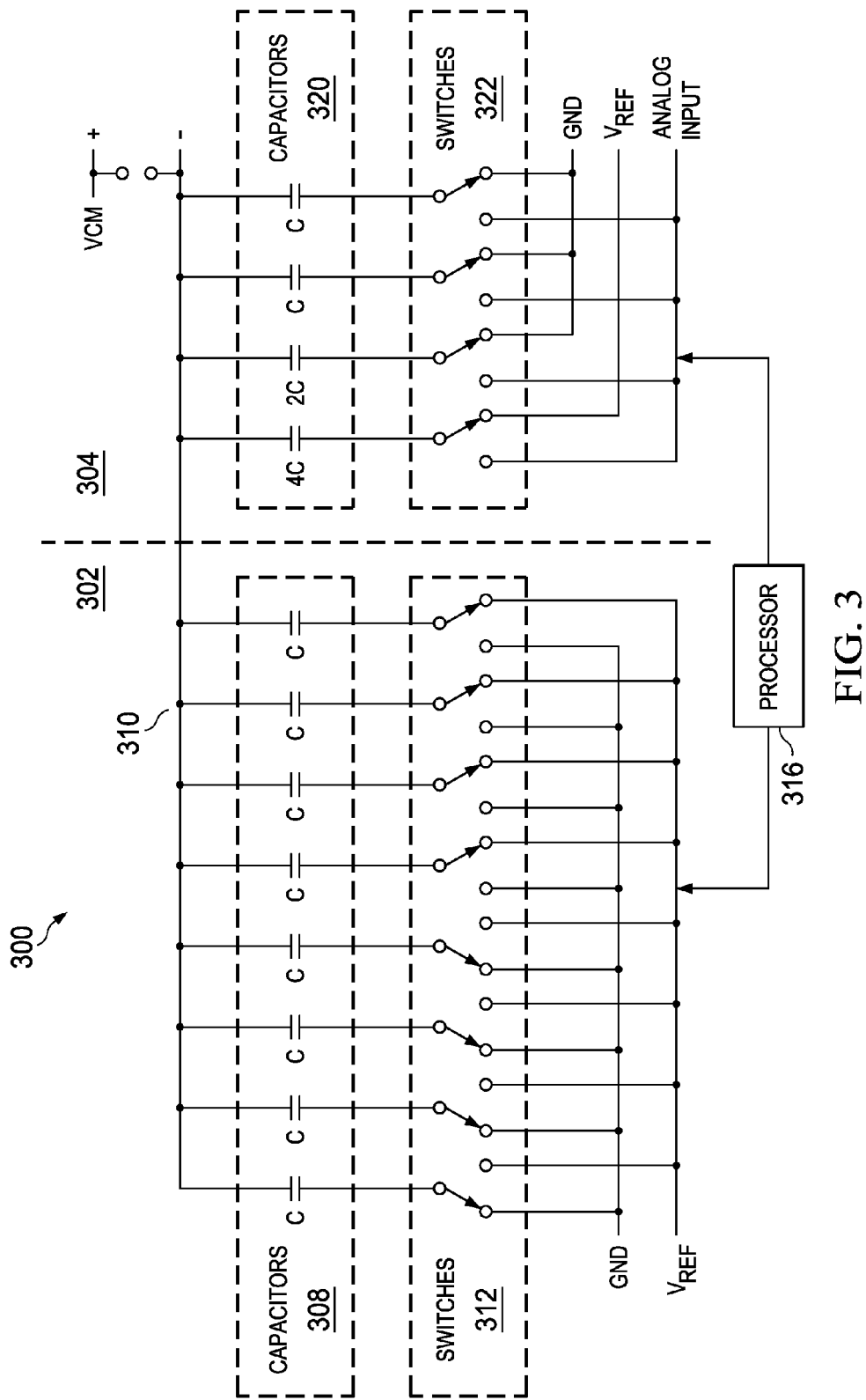
FIG. 3 is exemplary circuitry of voltage ramp generation of the ADCs of FIGS. 1 and 2.

FIG. 3 is a circuit diagram illustrating example circuitry 300 for generating the ramp voltage of the DACs 116 and 210 of FIGS. 1 and 2 combined with the adders 206 and 208 of FIG. 2. The circuitry 300 illustrates a capacitive DAC for generating the voltage waveforms, including voltage ramps, described above that do not generate the discontinuous waveforms generated by conventional DACs. The circuitry 300 includes two sub-circuits referred to as a reference DAC 302 located to the left of the dashed line and an input DAC 304 located to the right of the dashed line. The reference DAC 302 includes a plurality of first capacitors 308, each having equal value designated by C. The number of capacitors included in the plurality of first capacitors 308 is determined by the dynamic range requirements of the reference DAC 302 and the input DAC 304.

The top plates of the first capacitors 308 are coupled to a terminal 310. The bottom plates of the first capacitors 308 are coupled to a plurality of first switches 312 that couple the bottom plates to either ground GND or a reference voltage $V_{REF}$. A processor 316 sets the states of the first switches 312 and may have a clock similar to the clock 122 of FIG. 1. The clock determines when the first switches 312 change state.

The input DAC 304 includes a plurality of second capacitors 320 each having a value of C or a value that is a multiple of C. The number of capacitors or capacitance value included in the plurality of second capacitors 320 can be determined by the dynamic range requirements of the reference DAC 302 and the input DAC 304. The top plates of the second capacitors 320 are coupled to the terminal 310. The bottom plates of the second capacitors 320 are coupled to a plurality of second switches 322 that couple the bottom plates to either ground GND, the reference voltage $V_{REF}$, or the analog input signal as described below. The processor 316 controls the states of the second switches 322.

The input DAC 304 of FIG. 3 includes four second capacitors 320 wherein two capacitors have values of C, one capacitor has a value of 2 C, and one capacitor has a value of 4 C. The bottom plate of the 4 C capacitor is connectable to either the reference voltage $V_{REF}$ or the analog input. The bottom plates of the remaining capacitors are connectable to either ground GND or the voltage reference $V_{REF}$. The total capacitance of the input DAC 304 is equal to the total capacitance of the reference DAC 302.

The terminal 310 can be coupled to the constant voltage $V_{CM}$, which is the common mode voltage of the comparator in FIG. 2. Otherwise, the terminal 310 can be left unconnected, in which case the voltage at the terminal 310 is a weighted sum of the voltage reference $V_{REF}$ or GND, as coupled to the terminal 310 through the plurality of first capacitors 308 and first switches 312, and the voltage reference $V_{REF}$ or analog input or GND, as coupled to the terminal 310 through the plurality of second capacitors 320 and second switches 322. The reference voltage $V_{REF}$ in the example of FIG. 3 is twice the voltage $V_{CM}$.

In a reset mode, which is the switch setting shown in FIG. 3, the bottom plates of half of the first capacitors 308 are coupled to ground GND and the bottom plates of the other half of the first capacitors 308 are coupled to the reference voltage $V_{REF}$. These couplings are achieved by the processor 316 setting the first switches 312 accordingly, which provides for a mid value for the code of the reference DAC 302. Because the common mode voltage $V_{CM}$ is equal to half the reference voltage $V_{REF}$, half of the capacitance value of the second capacitors 320 in the analog input DAC 304 is coupled to the reference voltage $V_{REF}$ and the other half of the capacitance value is coupled to ground GND. As described above, the top plates of all of the capacitors 308 and 320 are coupled to the terminal 310, which is coupled to the voltage $V_{CM}$ and is equal to $V_{REF}/2$, so the net charge stored on all the capacitors 308 and 320 is zero.

In a continuous mode of operation wherein the circuitry 300 continuously sums the input analog signal to the ramp voltage, the terminal 310 is disconnected from the voltage $V_{CM}$. The bottom plates of the second capacitors 320 are coupled to the analog input by way of the second switches 322, which enables continuous transmission of the analog input signal without the requirement of sample and hold circuits required in some conventional ADCs. The bottom plates of the first capacitors 308 are connected to the reference voltage $V_{REF}$ or ground GND incrementally per instructions from the processor 316.

The processor 316 provides a counter for the first switches 312 to incrementally connect the first capacitors 308 to the reference voltage $V_{REF}$ or the ground GND depending on whether the voltage on the terminal 310 is to increase or decrease. In the example of FIG. 3, there are eight first capacitors 308, so the processor 316 may function as a three bit counter. As the count is incremented one least significant bit, successive first capacitors 308 are connected to or disconnected from the voltage reference $V_{REF}$. Because the reference DAC 302 associated with the first capacitors 308 is a 3-bit thermometric implementation, the effective voltage change at the top plates of the total reference DAC 302 capacitance is $V_{REF}/8$. The Reference DAC 302 forms a capacitive divider with the analog input DAC 304, so the gain from the bottom plates of the second capacitors 320 in the reference DAC 302 to the terminal 310 is 0.5. The effective voltage change at the terminal 310 would be $V_{REF}/16$ for a fully settled output, meaning that the voltages across the capacitors 308 have full settled. Since the analog input signal is compared continuously with the ramp voltage, any discontinuous time error on the DAC output will limit the performance. For example, the effective number of bits (ENOB) will be reduced in the digital signal.

The settling time of the output or the voltage $V_{CM}$ is determined by the RC time constant of the active current path associated with the terminal 310. The capacitance of the active current path is primarily determined by the first and second capacitors 308 and 320. The resistance of the active current path is determined by the ON resistances of the switches 312 and 322 and resistances that are not shown and that may be coupled to the terminal 310 and other nodes within the circuitry 300. Conventional DACs have outputs that fully settle between transitions of the switches, so the time between switch transitions is much longer than the RC time constants. For example, the voltages on the capacitors within the DACs have finished changing or have significantly settled before the switches coupled to the capacitors change state.

Figure 4A:
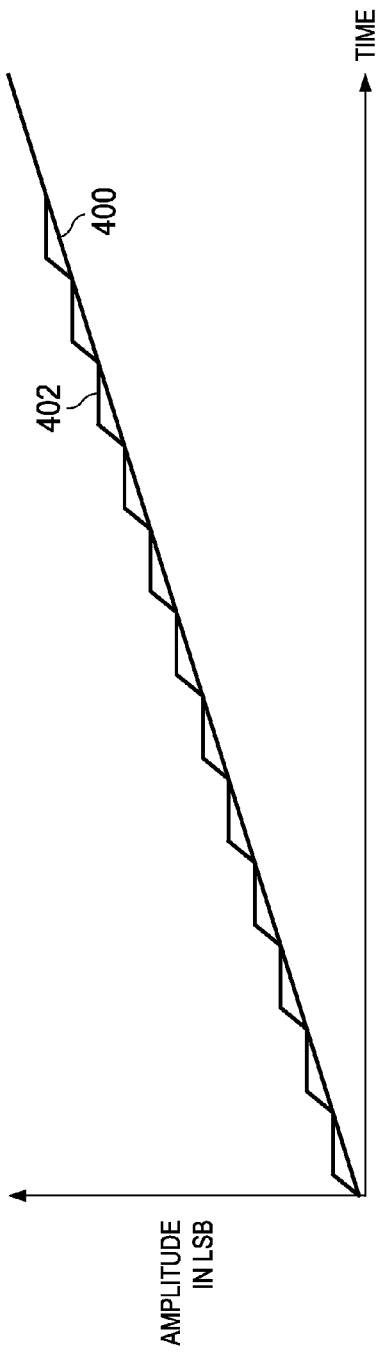
FIG. 4A is a graph showing an ideal ramp voltage and a graph showing an example of a discontinuous ramp voltage.

FIG. 4A is a graph showing an ideal ramp voltage and an example of a discontinuous ramp voltage. A ramp function 400 shows an ideal voltage ramp function. A discontinuous ramp function 402 shows an example of the resulting ramp function when the voltages at a node, such as the terminal 310, FIG. 3, when the circuitry 300 is operated in a conventional manner. As shown by the function 402, the ramp voltage settles prior to the transitioning of the first switches 312. In this example, the second switches 322 as shown in FIG. 3 are continuously connected to an analog DC input so that there is no transmission of the analog input signal to the terminal 310.

Figure 4B:
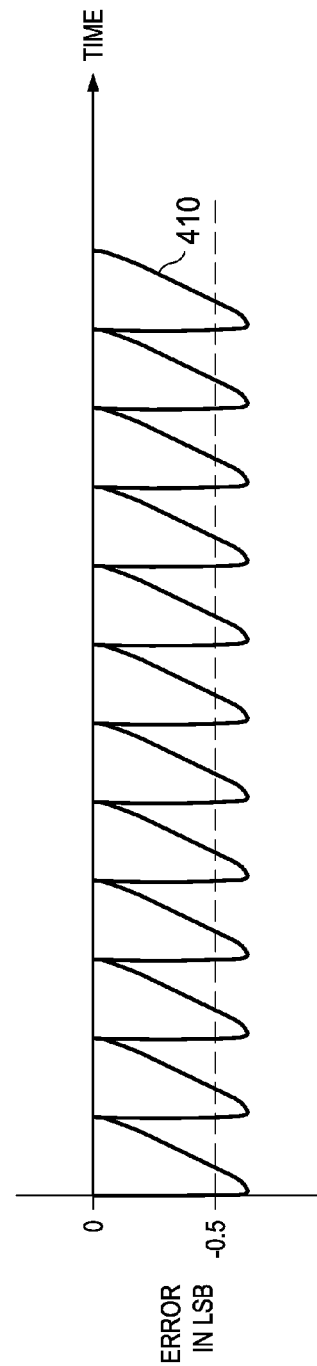
FIG. 4B is a graph showing the error resulting from the discontinuous ramp voltage of FIG. 4A.

In the example of FIG. 4A, the clock period between transitions of the switches 312 is ten times the RC time constant associated with the first and second capacitors 308 and 320. As shown in FIG. 4A, the resulting ramp function 402 is discontinuous and results in errors when applying the ramp function 402 to the terminal 310 as shown in FIG. 3. FIG. 4B is a graph showing the error resulting from the discontinuous ramp function 402 of FIG. 4A. The discontinuous ramp function 402 results in least significant bit errors shown by the error plot 410 of FIG. 4B. The error plot 410 is a plot of the difference between the actual DAC output, which is the discontinuous ramp function 402, and the ideal ramp function 400.

As shown by the error plot 410, it is difficult to achieve a peak error less than 0.7 of the least significant bit. Better results are achieved by not allowing the voltages on the capacitors 308 and 320 the DACs 302 and 304 of FIG. 3 to settle fully. The clocking or transitioning of the switches 312 performed by the processor 316 is such that the clock period between switch transitions is significantly less than the settling time of the voltages on the capacitors 312 and 320 in the DACs 302 and 304. This mode of operation is sometimes referred to as a partially settled DAC.

The operation of the partially settled DAC commences with a first clock pulse to a counter in the processor 316 that increments/decrements the count to the first switches 312 by one least significant bit. Accordingly, the first switches 312 change state at this time. The voltage on the terminal 310 follows the voltage changes by the RC time constant associated with the first and second capacitors 308 and 320 and the gain associated with the input switches 312 and 322. While the voltage on the first and second capacitors 308 and 320 is still settling from this switch transition, another clock pulse increments/decrements the counter by one least significant bit by changing the state of the first switches 312. As a result, the voltage of the terminal 310 follows the changes resulting from the changes in the switch states. This operation continues for a plurality of clock cycles. By not allowing the voltage on the terminal 310 to settle, errors less than 0.7 of the least significant bit can be achieved, which results in a higher ENOB.

Figure 5A:
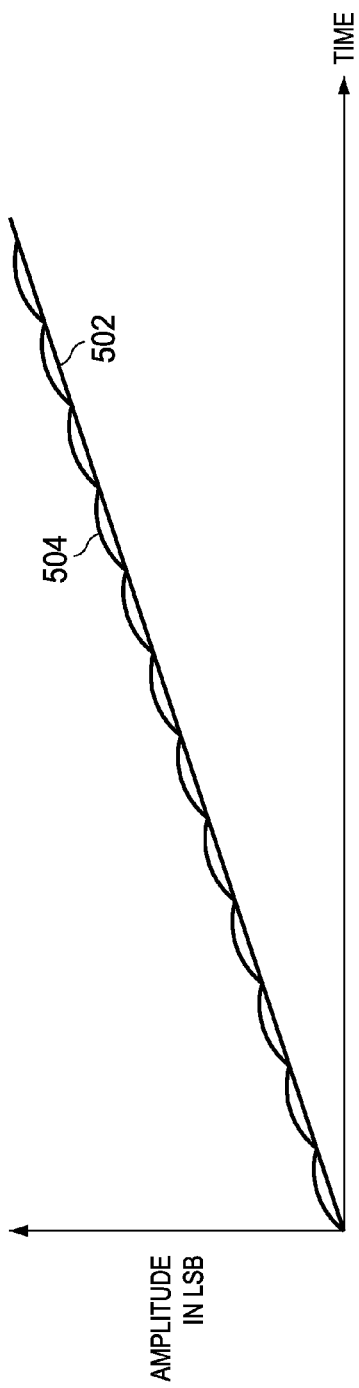
FIG. 5A is a graph showing an ideal ramp voltage and a graph showing an example of the ramp voltage generated by the DAC of FIG. 3.
Figure 5B:
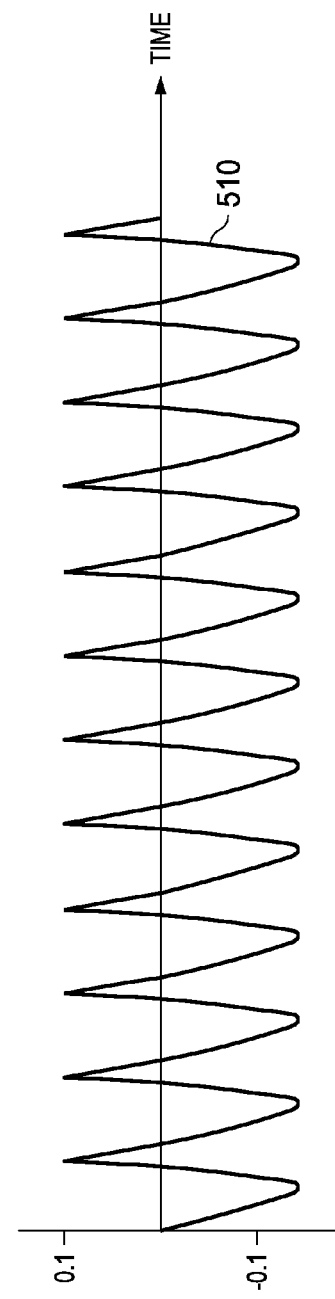
FIG. 5B is a graph showing the error resulting from the continuous ramp voltage of FIG. 5A.

FIG. 5A is a graph showing an ideal ramp voltage 502 and an example of a continuous ramp voltage 504 generated by the DAC of FIG. 3 wherein the voltages across the capacitors 308 and 320 do not fully settle. FIG. 5B is a graph showing the error plot 510 resulting from the ramp voltage 504 of FIG. 5A. In the embodiment of FIGS. 5A and 5B, the clock period between changes in the states of the first switches 312 is twice the RC time constant associated with the capacitors 308 and 320. As shown by the continuous ramp voltage 504, there is very little variability in the ramp voltage. Likewise, the error plot 510 shows that the error is only approximately 0.1 or 0.2 peak-to-peak of the least significant bit. Accordingly, the circuitry 300, when operated as described above, provides a much better voltage reference than conventional waveforms generated by DACs.

In some examples, the clock period is calibrated or calculated by the processor 316 so as to track the variation of process parameters associated with the manufacturing process of the circuitry 300. In such examples, the processor 316 determines the RC time constant of the circuitry 300 with the help of other circuitry, not shown here.

Referring again to FIG. 5A, the voltage plot 504 is substantially linear in the first order. Hence, the delay dispersion of the comparator 214, FIG. 2, can be controlled. Delay dispersion of the comparator 214 is referred to as the change in propagation delay of the comparator 214 with various input conditions such as slope of the input signal and the voltage difference between nodes 108 and 112 as shown in FIG. 1. Referring to the error plot 510, since the error plot 510 has a repeatable pattern, the error profile can be used to post-calibrate the output of the comparator 214 to get better ENOB using a time-to-digital converter (TDC) that is limited by the error in time-stamp.

Figure 6:
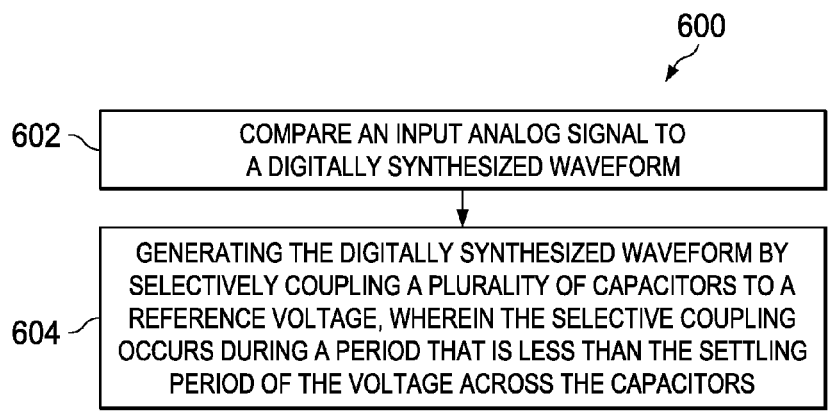
FIG. 6 is a flow chart describing an example of the operation of the DAC of FIG. 1.

FIG. 6 is a flow chart 600 describing an example of the operation of the DAC 100. Step 602 includes comparing an input analog signal to a digitally synthesized waveform. Step 604 includes generating the digitally synthesized waveform by selectively coupling a plurality of capacitors to a reference voltage, wherein the selective coupling occurs during a period that is less than the settling period of the voltage across the capacitors.

While some examples of analog to digital converters have been described in detail herein, it is to be understood that the inventive concepts may be otherwise variously embodied and employed and that the appended claims are intended to be construed to include such variations except insofar as limited by the prior art.

What is claimed is:

1. An analog to digital converter comprising:
   an analog input;
   a voltage comparator coupled to the analog input for comparing a voltage at the analog input to a digitally synthesized waveform;
   a digital to analog converter (DAC) for generating the digitally synthesized waveform, the DAC includes a plurality of capacitors selectively connected in parallel wherein the period between the selection of capacitors is less than the settling time of the voltage across the capacitors;
   wherein the period of the selection is approximately twice the settling time of the voltage across the capacitors.

2. An analog to digital converter comprising:
   an analog input;

a voltage comparator coupled to the analog input for comparing a voltage at the analog input to a digitally synthesized waveform;

a digital to analog converter (DAC) for generating the digitally synthesized waveform, the DAC includes a plurality of capacitors selectively connected in parallel wherein the period between the selection of capacitors is less than the settling time of the voltage across the capacitors;

wherein the capacitors have an RC time constant associated with them and wherein the period of the selection is less than twice the RC time constant.

3. An analog to digital converter comprising:

an analog input;

a voltage comparator coupled to the analog input for comparing a voltage at the analog input to a digitally synthesized waveform;

a digital to analog converter (DAC) for generating the digitally synthesized waveform, the DAC includes a plurality of capacitors selectively connected in parallel wherein the period between the selection of capacitors is less than the settling time of the voltage across the capacitors;

wherein the capacitors have an RC time constant associated with them and wherein the period of the selection is less than the RC time constant.

4. An analog to digital converter comprising:

an analog input;

a voltage comparator coupled to the analog input for comparing a voltage at the analog input to a digitally synthesized waveform;

a digital to analog converter (DAC) for generating the digitally synthesized waveform, the DAC includes a plurality of capacitors selectively connected in parallel wherein the period between the selection of capacitors is less than the settling time of the voltage across the capacitors;

wherein the DAC has a first portion for generating a reference voltage and a second portion coupled to the analog input, wherein the first portion has a capacitance value associated therewith and wherein the second portion has an equal capacitance value associated therewith.

5. An analog to digital converter comprising:

an analog input;

a voltage comparator coupled to the analog input for comparing a voltage at the analog input to a digitally synthesized waveform;

a digital to analog converter (DAC) for generating the digitally synthesized waveform, the DAC includes a plurality of capacitors selectively connected in parallel wherein the period between the selection of capacitors is less than the settling time of the voltage across the capacitors;

wherein the DAC includes a counter having an up-down control coupled to the output of the voltage comparator.

6. The analog to digital converter of claim 5, wherein the output of the counter determines which of the first capacitors are coupled to a common reference voltage.

7. The analog to digital converter of claim 5, wherein the output of the voltage comparator determines whether the counter increments or decrements.

8. A method of operating an analog to digital converter, the method comprising:

comparing an input analog signal to a digitally synthesized waveform;

generating the digitally synthesized waveform by selectively coupling a plurality of capacitors to a reference voltage, wherein the selective coupling occurs during a period that is less than the settling period of the voltage across the capacitors;

wherein the capacitors have an RC time constant associated with them and wherein the selective coupling occurs during a period that is less than twice the RC time constant.

9. A method of operating an analog to digital converter, the method comprising:

comparing an input analog signal to a digitally synthesized waveform;

generating the digitally synthesized waveform by selectively coupling a plurality of capacitors to a reference voltage, wherein the selective coupling occurs during a period that is less than the settling period of the voltage across the capacitors;

wherein the period of the selection is approximately twice the settling time of the voltage across the capacitors.

10. A method of operating an analog to digital converter, the method comprising:

comparing an input analog signal to a digitally synthesized waveform;

generating the digitally synthesized waveform by selectively coupling a plurality of capacitors to a reference voltage, wherein the selective coupling occurs during a period that is less than the settling period of the voltage across the capacitors;

wherein the capacitors have an RC time constant associated with them and wherein the period of the selection is less than the RC time constant.

11. A method of operating an analog to digital converter, the method comprising:

comparing an input analog signal to a digitally synthesized waveform;

generating the digitally synthesized waveform by selectively coupling a plurality of capacitors to a reference voltage, wherein the selective coupling occurs during a period that is less than the settling period of the voltage across the capacitors;

further comprising operating a counter, wherein the output of the counter determines the capacitance coupled to the reference voltage.

12. The method of claim 11, further comprising comparing the analog input and the digitally synthesized waveform, wherein up or down count of the counter is in response to the comparison of the analog input and the digitally synthesized waveform.

13. An analog to digital converter comprising:

an analog input;

a voltage comparator coupled to the analog input for comparing a voltage at the analog input to a digitally synthesized waveform;

a counter coupled to the output of the voltage comparator, wherein the counter increments or decrements in response to the output of the comparator;

a digital to analog converter (DAC) coupled to the output of the counter for generating the digitally synthesized waveform in response to the output of the counter, the DAC includes a plurality of capacitors selectively connected in parallel wherein the period between the selection of capacitors is less than the settling time of the voltage across the capacitors.

14. The analog to digital converter of claim 13, wherein the period of the selection is approximately twice the settling time of the voltage across the capacitors.

15. The analog to digital converter of claim 13, wherein the capacitors have an RC time constant associated with them and wherein the period of the selection is less than twice the RC time constant.

16. The analog to digital converter of claim 12, wherein the DAC has a first portion for generating a reference voltage and a second portion coupled to the analog input, wherein the first portion has a capacitance value associated therewith and wherein the second portion has an equal capacitance value associated therewith.

* * * * *